United States Patent [19]

Mohan

[11] Patent Number: 4,931,021

[45] Date of Patent: Jun. 5, 1990

[54] REVERSIBLE HIGH DENSITY ELECTRICAL CONNECTOR APPARATUS

[75] Inventor: Paul Mohan, Northville, Mich.

[73] Assignee: Environmental Research Institute of Michigan, Ann Arbor, Mich.

[21] Appl. No.: 211,260

[22] Filed: Jun. 24, 1988

[51] Int. Cl.[5] .............................................. H01R 9/07
[52] U.S. Cl. .................................... 439/285; 439/284
[58] Field of Search ............... 439/284, 285, 625, 626, 439/262; 24/387

[56] References Cited

U.S. PATENT DOCUMENTS

| | | | |
|---|---|---|---|
| 3,622,936 | 11/1971 | Negishi | 439/285 |
| 3,670,291 | 6/1972 | Garcia | 439/262 |
| 3,753,201 | 8/1973 | Ohman | 439/285 |
| 4,062,090 | 12/1977 | Moolenaars | 24/387 |

Primary Examiner—Neil Abrams
Attorney, Agent, or Firm—Krass & Young

[57] ABSTRACT

The present invention comprises apparatus for connecting and disconnecting substantially planar arrays of electrical contact sites in a mechanically secure and functionally rapid and reversible manner. The invention utilizes technology availalble in the zipper manufacturing industry, to achieve a high contact site density by suitably disposing contact sites for electrical connections on zipper teeth, and through the use of a conventional zipper-type runner achieving the interconnection of a multiplicity of electrical contact sites.

10 Claims, 4 Drawing Sheets

REVERSIBLE HIGH DENSITY ELECTRICAL CONNECTOR APPARATUS

FIELD OF THE INVENTION

The present invention generally relates to electrical interface mechanisms, and more particularly is concerned with mechanically reversible connection apparatus for connecting a pair of essentially planar electrical contact site arrays.

DESCRIPTION OF THE PRIOR ART

Existing methods of performing reversible interconnections of electrical or optoelectronic apparatus are well known in the industry. Typically they employ a male pin/female plug configuration, which fit together by orienting the pins to their respective plugs and by applying mechanical pressure to mate them. This pin/plug configuration is held together by friction of the connection itself. In addition some form of suitably displaced clip or threaded collar arrangement may be used in many instances.

There are many disadvantages to this conventional method of interconnecting electrical contacts. The industry has placed a continuing demand on reducing the physical dimensions of electrical subsystems and their associated packaging. When the spatial density of connection sites reaches a level greater than roughly 10 or 20 connection sites per inch the conventional pin/plug configurations for connecting these contacts are no longer efficient. At this point, the necessary dimensions of the pin/plug configuration becomes such that they are easily damaged during connector mating. Tolerances of a higher spatial density pin/plug arrangement becomes very critical, raising the cost of producing the connector. In addition, executing the connection process becomes tedious.

Other mass interconnection schemes have evolved for use in dedicated test fixtures to probe large scale integrated circuits or silicon wafer circuit boards. These types of connectors are typically quite large and expensive and are not geared toward low cost, high volume production.

There thus exists a need in the industry electrical connectors suitable for connections of the reduced physical dimensions of electrical subsystems and their associated packaging. The required spatial density of input/output sites in various electronic systems can typically reach 100 sites per inch. This trend toward higher density sites can even be expected to increase in the future. In addition, a need exists for a scheme to reversibly interconnect the electronic subsystems to permit or to increase configurability and maintainability. These requirements exist beyond the capabilities of conventional connector interface mechanisms previously described.

SUMMARY OF THE INVENTION

The present invention provides an improvement over the prior electrical connector apparatus and is designed to provide high spatial density and a reduced physical dimension configuration which is easily connected and disconnected.

Accordingly, the present invention relates to a high density connector which eliminates the conventional male/female pin/plug concept and utilizes two rows of mating contact points configured to form a "zipper" mechanism. For electrical connections, each row consists of electrically conductive teeth arranged in a one-dimensional array supported on a flexible substrate. Each tooth of the zipper mechanism is divided into plural mating contact points, up to 8, by insulating layers. A flexible conductive path connects each contact point to its respective interface site along the outer edge of the flexible substrate. These interface sites can then be electrically bonded to the input/output pads on the surface of a circuit board or wafer. This effectively mounts ½ of the high density electrical connector on said circuit board or wafer. The other half of the high density electrical connector can similarly be mounted on a second circuit board or wafer, and by using a conventional zipper type runner the two circuit boards or wafers are effectively, yet reversibly, connected. In addition to the mechanical and electrical connection of two circuit boards, the present invention also allows a circuit board to be connected to individual conductors of a cable system, or to connect individual conductors of two cable systems.

The present invention provides many advantages over existing electrical connection methods. It allows a much higher connector site density than present methods reliably permit. This invention can easily obtain a connector site density of 100 sites per inch. In addition, the present invention provides a selfregistering mechanism which automatically aligns contact points. It increases the ease and speed of executing the connection and disconnection procedure for a massive number of contact points. It provides a mechanically reliable, durable and relatively low cost method for achieving these results. In addition this method requires minimal vertical space above the surface of a circuit board or wafer to which the connector is mounted by virtue of its flat, planar nature. Finally this apparatus utilizes a well established base of manufacturing methods and techniques which have evolved throughout the course of large scale production of conventional zipper mechanisms.

DESCRIPTION OF THE PREFERRED EMBODIMENTS

Figure 1:
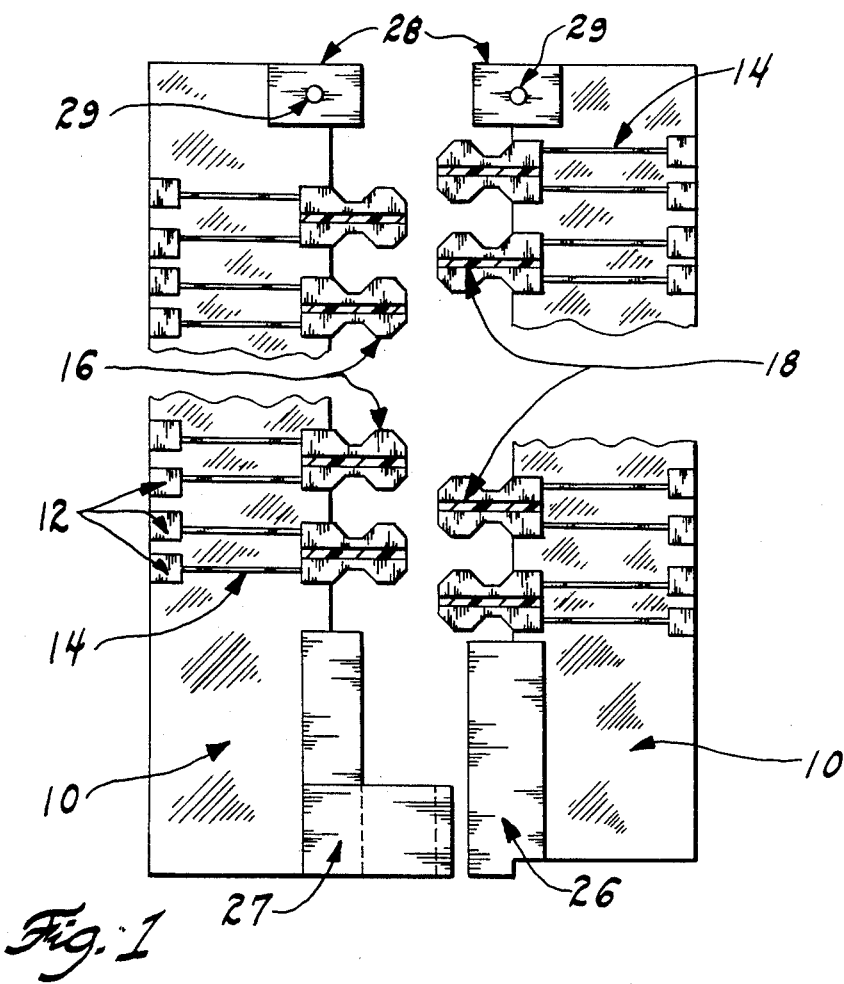
FIG. 1 illustrates a section of a first embodiment of the present invention in an unconnected mode.
Figure 2:
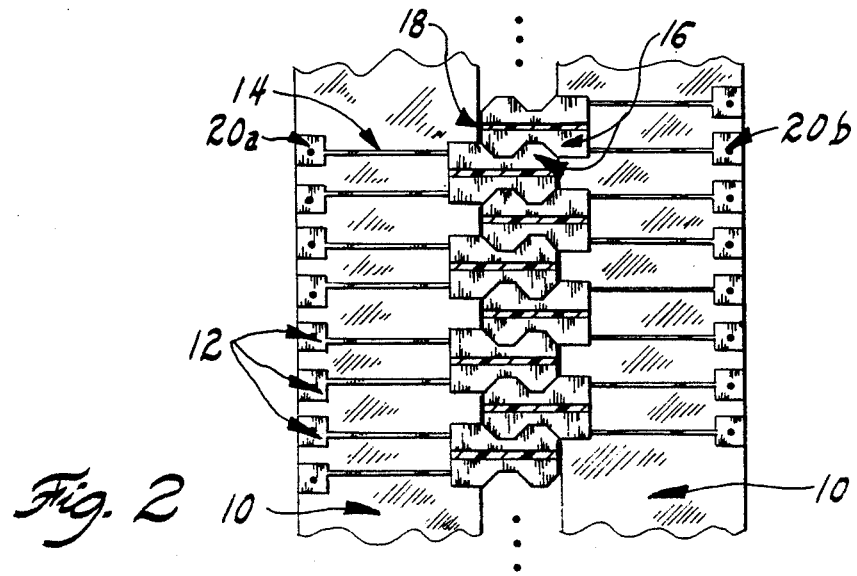
FIG. 2 illustrates the first embodiment of the present invention in a closed configuration.
Figure 3:
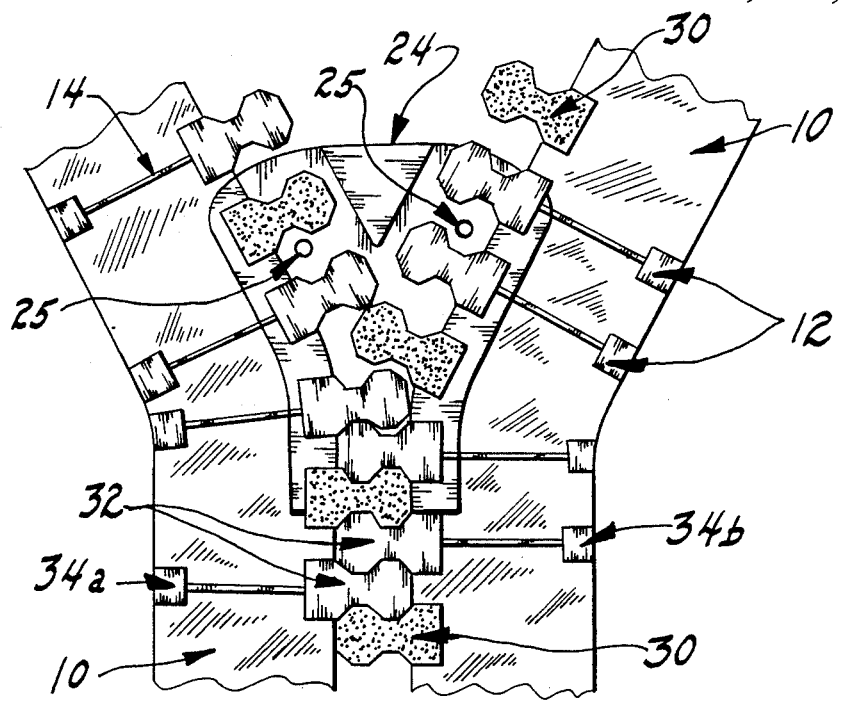
FIG. 3 illustrates an alternative embodiment of the present invention further depicting the zipper runner in operation.

Referring now to FIGS. 1 and 2 there is shown a section of the first embodiment of the present invention. The present invention is composed of a pair of flexible support substrate strips 10 upon which are disposed a plurality of external contact sites 12 which provide an electrical connection surface to circuit boards, wafers or other external electrical apparatus. A flexible conductor 14 electrically links each of the external contact sites 12 to its corresponding internal contact site 16. In this first embodiment, a pair of internal contact sites 16 suitably divided by an insulation layer 18 form a single "tooth" as found in a conventional zipper mechanism. A plurality of these "teeth" are disposed on the flexible support substrate strips 10 in a manner well known in the field of zipper manufacture so that when a conventional zipper type runner (as is depicted in FIG. 3, zipper runner 24) is utilized the teeth on each of said flexible support substrate strips are brought together at precisely the correct angle to facilitate their meshing, providing both mechanical and electrical connection between the flexible support substrate strips 10. In so doing, each specific external contact site 12 on one of said flexible support substrate strips 10 is connected to a corresponding specific external contact site 12 on the opposite flexible support substrate strip, as can be seen by the specific pair of external interface sites 12, labeled by reference numbers 20a and 20b in FIG. 2.

Referring now to FIGS. 1 and 3, to facilitate the use of the conventional zipper-type runner 24, an initial guide system, comprising male guide post 26 and female guide slot 27, and end stops 28 are utilized. In order to prevent the conventional zipper-type runner 24 from interfering with the electrical circuits made by interweaving the teeth, the zipper-type runner would typically be made of an insulating material. Further, after the zipper-type runner 24 has accomplished the connection, the zipper-type runner 24 would be secured to the end stops 28 by such means as the use of pins or set screws 25 engaging holes in the zipper-type runner 24 and into anchor holes 29. In this manner, the zipper-type runner 24 would be secured against accidental movement which would cause interference with the established electrical circuits. Additional methods of securing the zipper-type runner could be envisioned without departing from the spirit of the present invention.

By effectively splitting each "tooth" through the use of the insulation layer 18, potential electrical connector site density can in effect be doubled without changing the dimensions of the "teeth." This is a feature that is highly desirable in the present invention.

In order to maintain complete contact of the internal contact sites 16, the present invention requires some compressive forces. Primarily, sufficient compressive forces acting upon the connector teeth are provided through the form of the interlocking concavity within the teeth and can be formed so as to provide a spring receptacle employing the natural resilience of the tooth material. Additional secondary compression is delivered through the elasticity of the flexible nature of the substrate strips 10 that is displaced during the mating of the teeth and induces a bias pressure upon closure. This produces a grasping effect whereby each pair of teeth on one flexible substrate strip 10 compress around the tooth which is interleaved between them from the opposite flexible substrate strip. This grasping or pinching force assist in holding the internal contact sites 16 securely together.

To this end, the flexible support substrate strips 10 can be made of a number of existing materials, such as fluorocarbon composite, polyimide, Aramid or Polyester, which are all suitable for this purpose. In addition, these materials further serve to insulate the formed electrical circuits. The flexible conductor 14 can be made of rolled, annealed copper or aluminum to allow flexibility of the substrate strips 10. The composition and thickness of the flexible substrate 10 and the configuration of the embedded conductors can be varied to provide precise control of the impedance and cross-talk within the connector assembly, using methods well known in the electronics industry. The conducting teeth may be made of solid copper, silver or other conductors or composed of a non-conducting base upon which suitable conductors, such as gold, silver, or platinum are plated. By various combinations of materials for the individual components, suitably insulated electrical circuits are created with predetermined electrical properties.

Referring now specifically to FIG. 3, a second envisioned embodiment is additionally depicted. It can be seen that by utilizing single teeth as insulation teeth 30 and as internal contact teeth 32 the external contact sites 12, are effectively paired in a two tooth configuration such as for example 34 a and b, after the conventional zipper-type runner 24 has been utilized to align these teeth. While this does increase the spacing of the external contact sites 12 about the flexible support substrate strips 10, and therefore decrease the spatial density of the external contact sites 12, given the nature of the diminutive size of presently available teeth in the zipper manufacturing technology, this embodiment can still retain the benefit of a high electrical connector site density by utilizing the same or smaller tooth arrangement.

Figure 4:
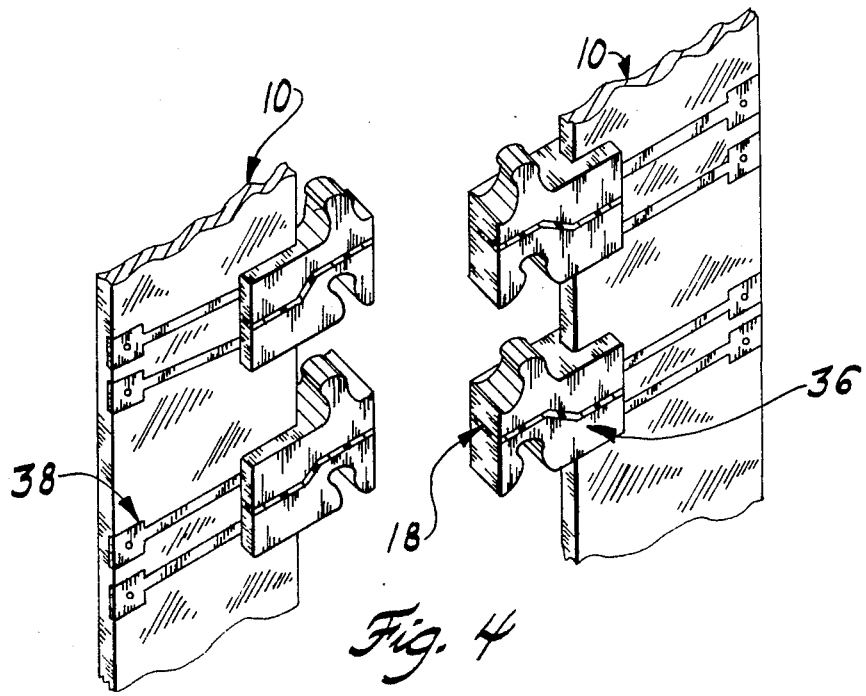
FIG. 4 illustrates a further alternative preferred embodiment of the invention.
Figure 5:
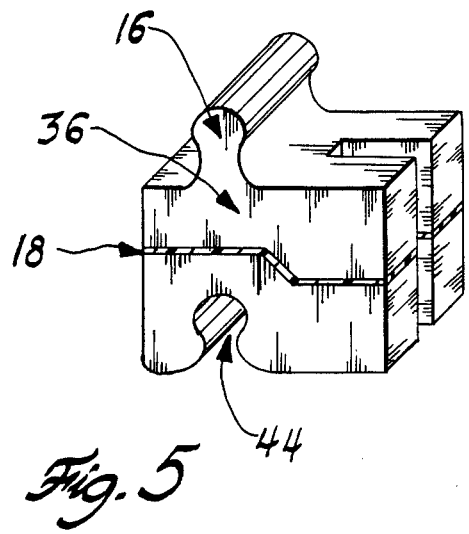
FIG. 5 illustrates in further detail one tooth employed in the further alternative preferred embodiment of the present invention.

FIGS. 4 and 5 represent the preferred embodiment of utilizing an interlocking teeth 36 and insulation layer 18 arrangement for electrical and mechanical interface of which many alternatives are possible. By utilizing a slot 44 and tab 46 arrangement, the interlocking teeth 36 cannot longitudinally separate. This causes the internal contacts to be held securely together and to a greater degree than can be provided by relying only on the compressive forces as described in the previous embodiment. In addition, the external contact sites 12 and flexible conductors 14 can be combined into an external contact site/flexible conductor combination 38 if manufacturing concerns so dictate.

Figure 6:
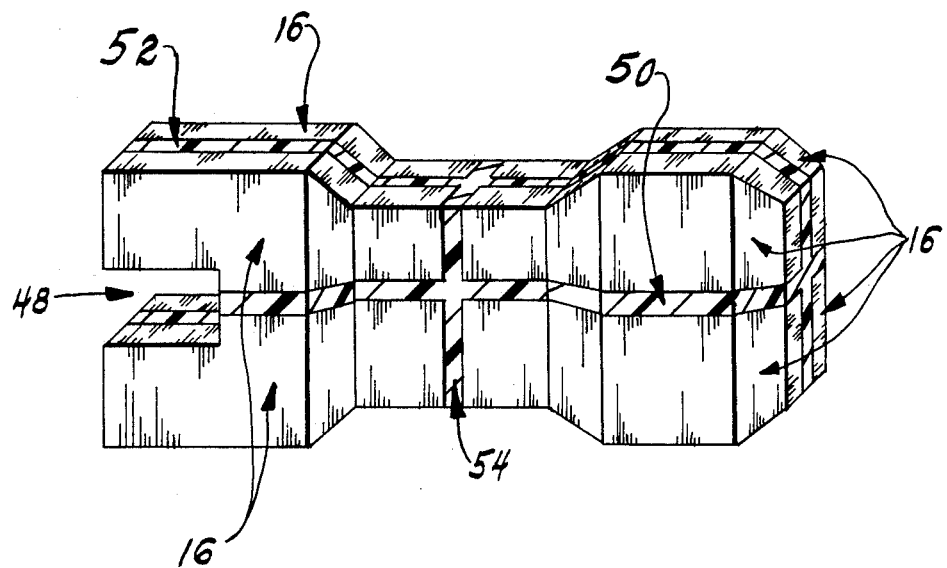
FIG. 6 illustrates alternative configurations of insulation layers in the first embodiment.

Referring now to FIG. 6, it can be seen that by strategically placing the insulation on each tooth as previously described a number of different patterns for the internal contact sites 16 can be achieved. With reference from substrate slot 48, which permits mounting to the flexible support substrate strip (omitted for clarity), the insulation can form a horizontal layer 50, vertical layer 52 or longitudinal layer 54. By utilizing a plurality of these layers, a variety of configurations of internal contact sites 16 can be achieved using one or more of each differently oriented insulation layer. In the depicted configuration the three insulation layers form eight internal contact sites 16. Each contact site can be independently electrically connected to an external contact site through methods well known in the electronics industry. In this manner a connector site density of 100 per inch could be achieved with fifty teeth per inch per substrate strip if each tooth had two internal contact sites 16, twenty-five teeth per inch per substrate strip if each tooth had four internal contact sites 16, and so on. A density of fifty connector sites per inch could be achieved with half of the above progression. This is well within the technology of the zipper manufacturing industry and a improvement over the densities achievable with the present technology in electronic connections.

Figure 7:
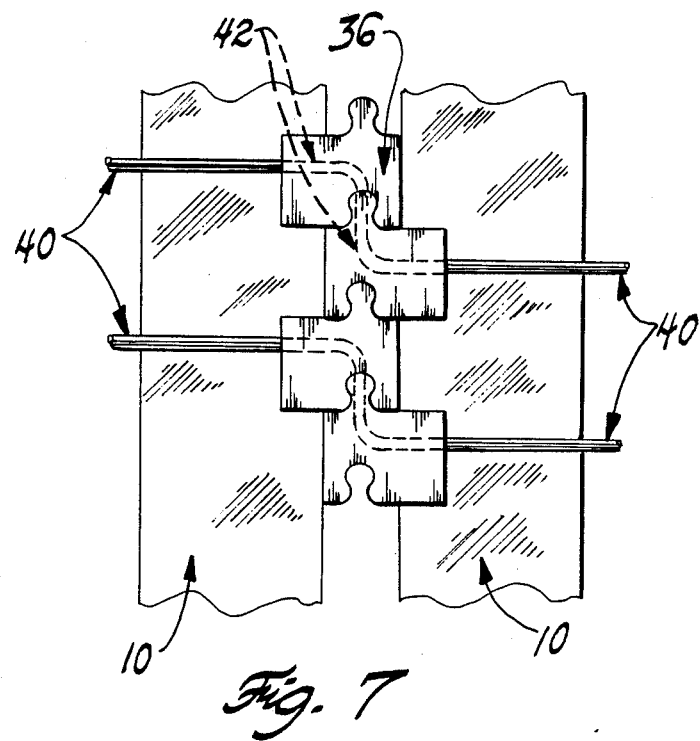
FIG. 7 illustrates an optical/mechanical alternative embodiment of the invention.
Figure 8:
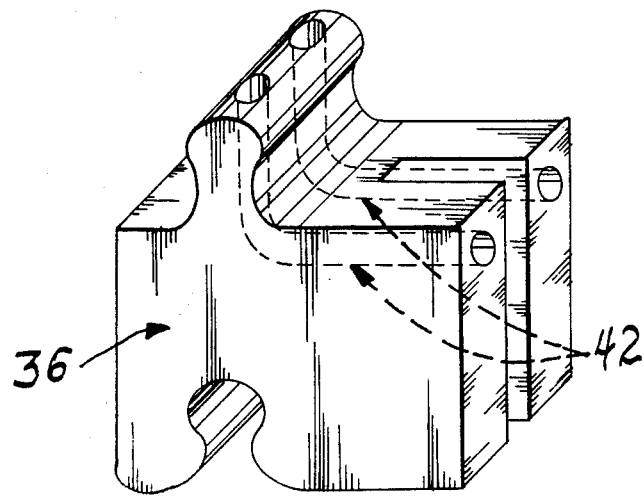
FIG. 8 illustrates in further detail one tooth employed in the optical/mechanical alternative embodiment of the invention.

Referring now to FIGS. 7 and 8 a modification of the basic concept provides an optoelectronic and mechanical interconnection system for multiple fiber optic elements 40. Interlocking teeth 36, of a tab and slot configuration, are utilized in essentially the same form as previously outlined, being attached to flexible support substrate strips 10. The teeth 36 are composed of a material, such as a ceramic, which supports an integral optically transmissive conduit 42. The conduit 42 can be simply a channel for inserting the fiberoptic element 40 itself, or composed of a material, such as a polymer, whose refractive index properties are matched to those of the fiber elements 40. The optic elements 40 are thus attached to the interlocking teeth in a manner well known in the optic fiber industry, and can be supportively attached to the flexible support substrate strips 10. When the teeth are interlocked, pursuant to the previously outlined technique, the respective optical transmission paths, either the optical elements 40 themselves if they are inserted in the conduit 42 or the refractive material in the conduit 42 if such a material is utilized as an optically transmissive attachment site for the optical elements 40, from each interlocking teeth 36 are aligned and form a continuous optical signal path. A plurality of these paths could be formed in each tooth to provide higher density optical connections as shown in FIG. 8.

Having thus disclosed my invention, I claim:

1. A reversible means for mechanically and electrically connecting first and second substantially planar arrays of electrical contact sites comprising:

a first flexible support substrate strip having first and second opposed edges;

a plurality of first electrical conductors disposed on said first flexible support substrate strip, each first electrical conductor having a first end disposed at said first opposed edge of said first flexible support substrate strip electrically connected to a corresponding electrical contact site of said first array of electrical contact sites and a second end disposed at said second opposed edge of said first flexible support substrate strip;

a plurality of first interleavable teeth disposed at predetermined intervals along and extending beyond said second opposed edge of said first flexible support substrate strip, each of said plurality of first interleavable teeth including a conductive top left rear portion, a conductive top right rear portion, a conductive top left forward portion, a conductive top right forward portion, a conductive bottom left rear portion, a conductive bottom right rear portion, a conductive bottom left forward portion, a conductive bottom right forward portion, a first insulating section (54) disposed perpendicular to said first flexible support substrate strip between conductive rear and forward portions, a second insulating section (50) disposed paralled to said first flexible support substrate strip between conductive left and right portions, and a third insulating section (52) disposed perpendicular to both said first and second insulating sections between conductive top and bottom portions, and each of said conductive portions connected to the second end of a corresponding one of said plurality of first conductors;

a second flexible support substrate strip having first and second opposed edges;

a plurality of second electrical conductors disposed on said second flexible support substrate strip, each second electrical conductor having a first end disposed at said first opposed edge of said first flexible support substrate strip electrically connected to a corresponding electrical contact site of said second array of electrical contact sites and a second end disposed at said second opposed edge of said second flexible support substrate strip;

a plurality of second interleavable teeth disposed at predetermined intervals along and extending beyond said second opposed edge of said second flexible support substrate strip, each second interleavable tooth including a conductive top left rear portion, a conductive top right rear portion, a conductive top left forward portion, a conductive top right forward portion, a conductive bottom left rear portion, a conductive bottom right rear portion, a conductive bottom left forward portion, a conductive bottom right forward portion, a first insulating section (54) disposed perpendicular to said second flexible support substrate strip between conductive rear and forward portions, a second insulating section (50) disposed paralled to said second flexible support substrate strip between conductive left and right portions, and a third insulating section (52) disposed perpendicular to both said first and second insulating sections between conductive top and bottom portions, and each of said conductive portions connected to the second end of a corresponding one of said plurality of first conductors, said plurality of second interleavable teeth further disposed to interleave with said plurality of first interleavable teeth with each of said conductive top left rear portion of each of said plurality of first interleavable teeth in electrical contact with a corresponding conductive bottom left forward portion of a corresponding one of said plurality of second interleavable teeth, each of said conductive top right rear portion of each of said plurality of first interleavable teeth in electrical contact with a corresponding conductive bottom right forward portion of a corresponding one of said plurality of second interleavable teeth, each of said conductive top left forward portion of each of said plurality of first interleavable teeth in electrical contact with a corresponding conductive bottom left rear portion of a corresponding one of said plurality of second interleavable teeth, each of said conductive top right forward portion of each of said plurality of first interleavable teeth in electrical contact with a corresponding conductive bottom right rear portion of a corresponding one of said plurality of second interleavable teeth, each of said conductive bottom left rear portion of each of said plurality of first interleavable teeth in electrical contact with a corresponding conductive top left forward portion of a corresponding one of said plurality of second interleavable teeth, each of said conductive bottom right rear portion of each of said plurality of first interleavable teeth in electrical contact with a corresponding conductive top right forward portion of a corresponding one of said plurality of second interleavable teeth, each of said conductive bottom left forward portion of each of said plurality of first interleavable teeth in electrical contact with a corresponding conductive top left rear portion of a corresponding one of said plurality of second interleavable teeth, each of said conductive bottom right forward portion of each of said plurality of first interleavable teeth in electrical contact with a corresponding conductive top right rear portion of a corresponding one of said plurality of second interleavable teeth; and means (24) for reversibly interleaving said plurality of first interleavable teeth with said plurality of second interleavable teeth thereby mechanically connecting said first support base to said second support base and electrically connecting said each first electrical conductor with a corresponding second electrical conductor.

2. The invention of claim 1, wherein said flexibility of said first and second flexible support substrate strips provides longitudinal compression forces on said pluralities of first and second interleavable teeth thereby strengthening the mechanical connection of said first support base to said second support base and further enhancing the electrical connection of said first internal contact site and said second internal contact site.

3. The invention of claim 1, wherein the number of electrical circuit units is at least 50 per inch of said first and second flexible insulating support substrate strips.

4. The invention of claim 1, wherein the number of electrical circuit units is at least 100 per inch of said first and second flexible insulating support substrate strips.

5. The invention of claim 1 wherein said means for reversibly interleaving said plurality of first interleavable teeth with said plurality of second interleavable teeth includes a zipper-type slide mechanism consisting of two convergent channels that merge into a single channel thereby upon movement in one direction interleaving said plurality of first interleavable teeth, with said plurality of second interleavable teeth and upon movement in the opposite direction separating said plurality of first interleavable teeth and said plurality of second interleavable teeth.

6. The invention of claim 5, wherein said zipper-type slide mechanism further includes means for anchoring said zipper-type slide at the end of said movement which interleaves said plurality of first interleavable teeth with said plurality of second interleavable teeth.

7. The invention of claim 6, wherein said means for anchoring includes an opening in said zipper-type slide mechanism for the passage of a pin through said zipper-type slide mechanism.

8. The invention of claim 7, wherein said means for anchoring further includes said pin engaging an end stop disposed on said flexible substrate after passage of said pin through zipper-type slide mechanism.

9. A reversible means for mechanically and electrically connecting first and second substantially planar arrays of electrical contact sites comprising:

a first flexible support substrate strip (10) having first and second opposed edges;

a plurality of first electrical conductors (14) disposed on said first flexible support substrate strip, each first electrical conductor having a first end (12) disposed at said first opposed edge of said first flexible support substrate strip electrically connected to a corresponding electrical contact site of said first array of electrical contact sites and a second end disposed at said second opposed edge of said first flexible support substrate strip;

a plurality of first interleavable teeth disposed at predetermined intervals along and extending beyond said second opposed edge of said first flexible support substrate strip, each of said plurality of first interleavable teeth including at least one conductive rear portion disposed proximate said second opposed edge of said first flexible support substrate strip, at least one conductive forward section disposed remotely from said second opposed edge of said first flexible support substrate strip and an insulating section (54) disposed perpendicular to said first flexible support substrate strip between said at least one conductive rear portion and said at least one conductive forward portion, each of said at least one conductive rear portions and each of said at least one conductive forward portions connected to the second end of a corresponding one of said plurality of first conductors;

a second flexible support substrate strip (10) having first and second opposed edges;

a plurality of second electrical conductors (14) disposed on said second flexible support substrate strip, each second electrical conductor having a first end (12) disposed at said first opposed edge of said second flexible support substrate strip electrically connected to a corresponding electrical contact site of said second array of electrical contact sites and a second end disposed at said second opposed edge of said second flexible support substrate strip;

a plurality of second interleavable teeth disposed at predetermined intervals along and extending beyond said second opposed edge of said second flexible support substrate strip, each second interleavable tooth including at least one conductive rear portion disposed proximate said second opposed edge of said second flexible support substrate strip, at least one conductive forward section disposed remotely from said second opposed edge of said second flexible support substrate strip and an insulating section (54) disposed perpendicular to said second flexible support substrate strip between said at least one conductive rear portion and said at least one conductive forward portion, each of said at least one conductive rear portions and each of said at least one conductive forward portions connected to the second end of a corresponding one of said plurality of second conductors, said plurality of second interleavable teeth further disposed to interleave with said plurality of first interleavable teeth with each of said at least one conductive rear portion of each of said plurality of first interleavable teeth in electrical contact with a corresponding one of said at least one conductive forward portion of a corresponding one of said plurality of second interleavable teeth and each of said at least one conductive forward portion of each of said plurality of first interleavable teeth in electrical contact with a corresponding one of said at least one conductive rear portion of a corresponding one of said plurality of second interleavable teeth; and means (24) for reversibly interleaving said plurality of first interleavable teeth with said plurality of second interleavable teeth thereby mechanically connecting said first support base to said second support base and electrically connecting said each first electrical conductor with a corresponding second electrical conductor.

10. A reversible means for mechanically and electrically connecting first and second substantially planar arrays of electrical contact sites comprising:
- a first flexible support substrate strip (10) having first and second opposed edges;
- a plurality of first electrical conductors (14) disposed on said first flexible support substrate strip, each first electrical conductor having a first end (12) disposed at said first opposed edge of said first flexible support substrate strip electrically connected to a corresponding electrical contact site of said first array of electrical contact sites and a second end disposed at said second opposed edge of said first flexible support substrate strip;
- a plurality of first interleavable teeth disposed at predetermined intervals along and extending beyond said second opposed edge of said first flexible support substrate strip, each of said plurality of first interleavable teeth including at least one conductive left portion disposed on a first side of said first flexible support substrate strip, at least one conductive right section disposed on a second side of said first flexible support substrate strip and an insulating section (50) disposed paralled to said first flexible support substrate strip between said at least one conductive left portion and said at least one conductive right portion, each of said at least one conductive left portions and each of said at least one conductive right portions connected to the second end of a corresponding one of said plurality of first conductors;
- a second flexible support substrate strip (10) having first and second opposed edges;
- a plurality of second electrical conductors (14) disposed on said second flexible support substrate strip, each second electrical conductor having a first end (12) disposed at said first opposed edge of said second flexible support substrate strip electrically connected to a corresponding electrical contact site of said second array of electrical contact sites and a second end disposed at said second opposed edge of said second flexible support substrate strip;
- a plurality of second interleavable teeth disposed at predetermined intervals along and extending beyond said second opposed edge of said second flexible support substrate strip, each second interleavable tooth including at least one conductive left portion disposed on a first side of said second flexible support substrate strip, at least one conductive right section disposed on a second side of said second flexible support substrate strip and an insulating section (50) disposed parallel to said second flexible support substrate strip between said at least one conductive left portion and said at least one conductive right portion, each of said at least one conductive left portions and each of said at least one conductive right portions connected to the second end of a corresponding one of said plurality of second conductors, said plurality of second interleavable teeth further disposed to interleave with said plurality of first interleavable teeth with each of said at least one conductive left portion of each of said plurality of first interleavable teeth in electrical contact with a corresponding one of said at least one conductive left portion of a corresponding one of said plurality of second interleavable teeth and each of said at least one conductive right portion of each of said plurality of first interleavable teeth in electrical contact with a corresponding one of said at least one conductive right portion of a corresponding one of said plurality of second interleavable teeth; and
- means (24) for reversibly interleaving said plurality of first interleavable teeth with said plurality of second interleavable teeth thereby mechanically connecting said first support base to said second support base and electrically connecting said each first electrical conductor with a corresponding second electrical conductor.

* * * * *